(12) United States Patent
Kunsch et al.

(10) Patent No.: US 10,269,595 B2
(45) Date of Patent: Apr. 23, 2019

(54) SEAL FOR WAFER PROCESSING ASSEMBLY

(71) Applicant: Veeco Instruments Inc., Plainview, NY (US)

(72) Inventors: Ian Kunsch, Somerset, NJ (US); Brett Stuart Snowden, Manasquan, NJ (US); Gregory Williams, Jersey City, NJ (US); David Gant, South River, NJ (US); Aaron Frazier, Frenchtown, NJ (US)

(73) Assignee: VEECO INSTRUMENTS INC., Plainview, NY (US)

( * ) Notice: Subject to any disclaimer, the term of this patent is extended or adjusted under 35 U.S.C. 154(b) by 91 days.

(21) Appl. No.: 15/290,237

(22) Filed: Oct. 11, 2016

(65) Prior Publication Data

US 2018/0102266 A1  Apr. 12, 2018

(51) Int. Cl.
 *F16J 15/10*   (2006.01)
 *H01L 21/67*   (2006.01)
 *F16J 15/02*   (2006.01)

(52) U.S. Cl.
 CPC ...... *H01L 21/67126* (2013.01); *F16J 15/022* (2013.01); *F16J 15/025* (2013.01); *H01L 21/6719* (2013.01)

(58) Field of Classification Search
 CPC .......... F16J 15/02; F16J 15/021; F16J 15/022; F16J 15/06; F16J 15/061; F16J 15/062
 See application file for complete search history.

(56) References Cited

U.S. PATENT DOCUMENTS

| | | | |
|---|---|---|---|
| 3,245,693 A | 4/1966 | Way | |
| 4,059,280 A | 11/1977 | Eastwood | |
| 4,336,946 A | 6/1982 | Wheeler | |
| 6,938,902 B2 | 9/2005 | Devers | |
| 7,306,237 B2 * | 12/2007 | Tsuji | F16J 15/062 |
| | | | 277/644 |
| 8,808,456 B2 | 8/2014 | Kato et al. | |
| 9,447,881 B2 * | 9/2016 | Tsuji | F16J 15/064 |
| 9,587,744 B2 * | 3/2017 | Yoshida | F16J 15/025 |
| 2008/0191474 A1 | 8/2008 | Kotz | |

FOREIGN PATENT DOCUMENTS

| | | | | |
|---|---|---|---|---|
| JP | 2004316724 A | * | 11/2004 | ............ F16J 15/062 |
| JP | 2015086910 A | * | 5/2015 | ............ F16J 15/025 |
| WO | WO-2015064314 A1 | * | 5/2015 | ............ F16J 15/025 |

OTHER PUBLICATIONS

Kalrez® Seals for Semiconductor Processing, downloaded from DUPONT™ website prior to Oct. 11, 2016.
DUPONT™ Kalrez® TriLobe™ Seals, downloaded from DUPONT™ website prior to Oct. 11, 2016.

* cited by examiner

*Primary Examiner* — Gilbert Y Lee
(74) *Attorney, Agent, or Firm* — Holzer Patel Drennan

(57) ABSTRACT

A seal having a cross-sectional profile that includes a first lobe, a second lobe, and a corner having an angle between 45 and 90 degrees, inclusive, a first side extending from the first lobe to the corner and a second side extending from the second lobe to the corner, where the first side and the second side define the corner angle. The seal can be seated in a groove so that the first lobe and the corner are in the groove and the second lobe extends from the groove. In use, the second lobe folds into the groove to form a fluid-tight seal.

16 Claims, 7 Drawing Sheets

SEAL FOR WAFER PROCESSING ASSEMBLY

BACKGROUND

Many semiconductor devices are formed by processes performed on a substrate such as a wafer (e.g., silicon wafer). As an example, many semiconductor devices are formed by growing successive metal oxide layers using a CVD (chemical vapor deposition) system, such as a MOCVD (metal organic CVD) system. In such a process, the wafers are exposed to a gas or combination of gases which flow over the surface of the wafer while the wafer is maintained at an elevated temperature. Prior to the flow of gas(es), the chamber in which the wafer is located is evacuated of air. During the deposition process, the chamber may be at elevated pressure. The seals in the system are paramount to having accurate processing conditions.

SUMMARY

The technology described herein is directed to a gasket, O-ring or other such seated seal, particularly as used in a wafer processing system or assembly. The cross-sectional profile of the seal described herein provides an improved seal over a conventional O-ring, both in the fluid-tight seal provided and the ease of use (e.g., installing) of the seal.

The multi-lobe seal design disclosed herein provides more deflection or "squeeze" than an equivalent O-ring without exceeding the available gland fill. This is desirable, e.g., when one or both of the mating parts is not flat enough to ensure contact at all surfaces with a conventional O-ring (thus resulting in a leak) and there is not enough room to fit a traditional O-ring of the next available size. When sized, shaped and seated properly, the multi-lobe seal design also does not create a virtual leak, which is particularly important in vacuum applications. While other seal concepts might be capable of achieving this goal, a multi-lobe seal of this disclosure has the advantage over another non-round seal for the ease of assembly of two mating parts with the seal therebetween. The multi-lobe seal hugs the bottom wall and/or a wall of the groove or gland in which it is seated, inhibiting rolling or misalignment of the seal; this is particularly noticeable when the groove is circular and the seal lobes are symmetrical. The multi-lobe seal is easy to install in a 'dovetail' groove or gland and typically orients itself to hug the groove wall(s), at least the bottom wall and in some impelmentations, the inner diameter wall. Additionally, the multi-lobe seal has a relatively simple geometry, allowing it to be readily molded even when scaled down, for example to Ø.070 inch equivalent size.

The multi-lobe seals of this disclosure can be used for any application between two mating parts. The seal may be a radial seal or a face seal.

One particular implementation described herein is a seal having a cross-sectional profile that includes a first lobe, a second lobe, and a corner having an angle between 45 and 90 degrees, inclusive, a first side extending from the first lobe to the corner and a second side extending from the second lobe to the corner, where the first side and the second side define the corner angle.

Another particular implementation described herein is a seal seated in a groove, the groove defined by an inner wall, an outer wall and a bottom wall. The seal has a cross-sectional profile that includes a first lobe, a second lobe, and a corner, with a first side extending from the first lobe to the corner and a second side extending from the second lobe to the corner. The first lobe defines an outer-most surface of the seal and the corner defines an inner-most surface of the seal. In some implementations, the seal is circular, with the inner-most surface closest to the center point of the seal. The seal is seated with the first lobe proximate the outer wall of the groove, the first side is proximate the bottom wall, and the corner and the second side are proximate the inner wall.

Yet another particular implementation described herein is a method of providing a fluid-tight seal between a first part having a groove and a second part. The method includes seating a multi-lobed seal in the groove so that a first lobe and a corner of the seal are completely positioned in the groove and a portion of a second lobe extends out from the groove, and then placing the second part on the first part so that the second lobe folds into the groove.

These and various other implementations, features and advantages will be apparent from a reading of the following detailed description.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWING

FIG. 1A is an enlarged view of a portion of the assembly of FIG. 1; and FIG. 1B is an enlarged view of another portion of the assembly of FIG. 1.

DETAILED DESCRIPTION

Figure 1:
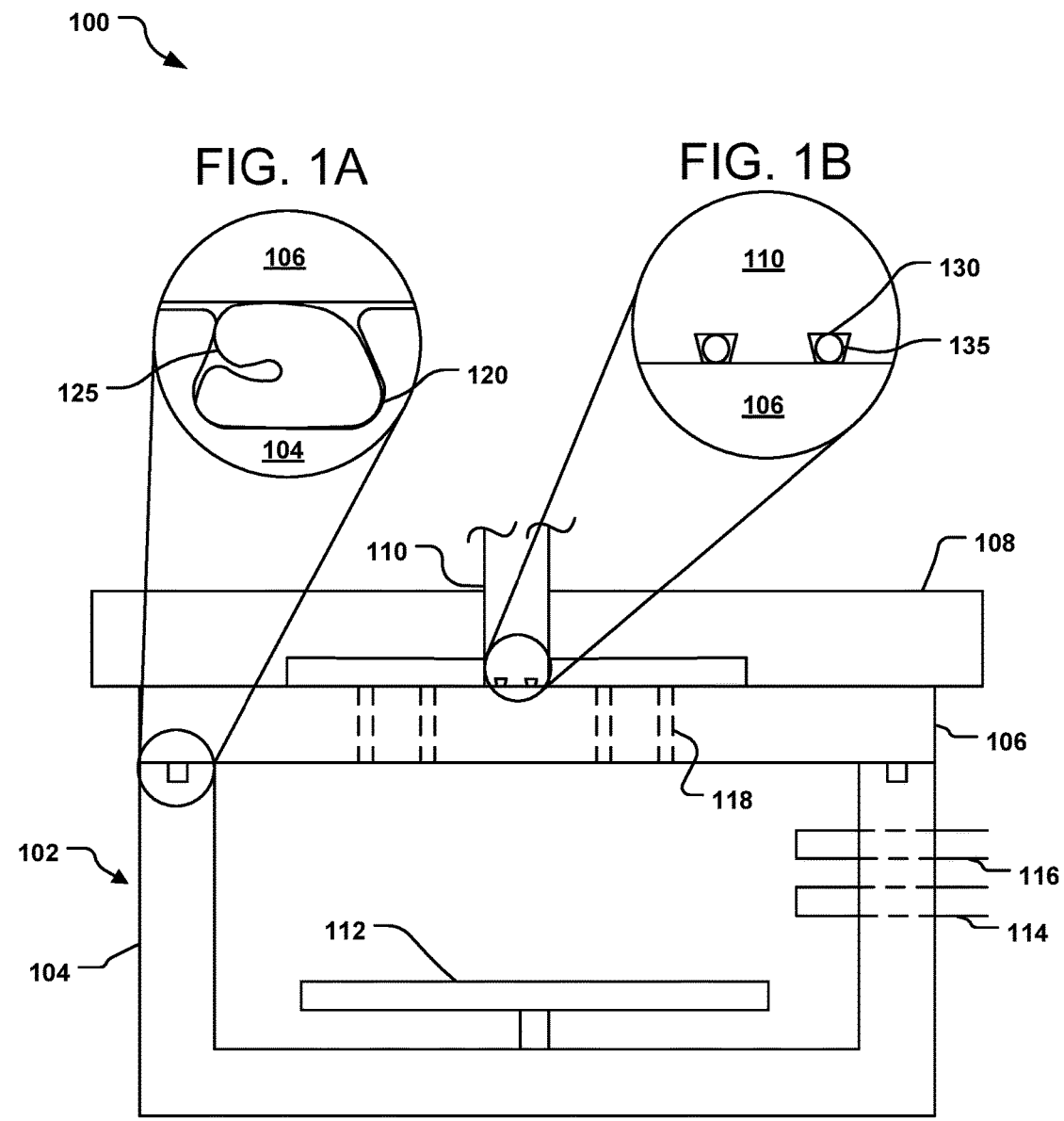
FIG. 1 is a schematic, cross-sectional side view of a generic wafer processing assembly.

The present description is directed to seals (also referred to as gaskets, O-rings, etc.) for sealing two abutting surfaces, with one of the surfaces having a groove therein that receives the seal. The seals described herein can be used in any system or assembly that utilizes O-rings, gaskets, or other such seals; the seals are particularly adapted for use with wafer processing assemblies and/or systems. The wafer processing system can be, for example, a CVD (chemical vapor deposition) system, MOCVD (metal organic CVD) system, ion beam deposition system, ion beam sputtering system, chemical etching system, ion milling system, physical vapor deposition (PVD) system, DLC (diamond-like carbon) deposition system, or other processing system.

In the following description, reference is made to the accompanying drawing that forms a part hereof and in which are shown by way of illustration specific implementations. The description provides additional specific implementations. It is to be understood that other implementations are contemplated and may be made without departing from the scope or spirit of the present invention. The following detailed description, therefore, is not to be taken in a limiting sense. While the present invention is not so limited, an appreciation of various aspects of the invention will be gained through a discussion of the examples provided below.

As used herein, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower", "upper", "beneath", "below", "above", "on top", etc., if used herein, are utilized for ease of description to describe spatial relationships of an element(s) to another. Such spatially related terms encompass different orientations of the device in addition to the particular orientations depicted in the figures and described herein. For example, if a structure depicted in the figures is turned over or flipped over, portions previously described as below or beneath other elements would then be above or over those other elements.

In some instances, a reference numeral in a figure may have an associated sub-label consisting of an upper-case letter to denote one of multiple similar components. When reference is made to a reference numeral without specification of a sub-label, the reference is intended to refer to all such multiple similar components.

FIG. 1, in a very basic manner, illustrates a wafer processing system 100, such as a CVD system. The particular system 100 is not paramount to the seals of this disclosure, but is provided as a generic wafer processing system in which a seal of this disclosure can be incorporated. The particular system 100 has only some parts shown, and shown generically with no particular design; it is to be understood that an actual CVD system or other wafer processing system has significantly more features present.

The wafer processing system 100 has a chamber 102 formed by, at least, a first part 104 and a second part 106 in which a wafer (not illustrated) is positioned for processing. In the particular implementation, the chamber 102 has a cylindrical volume, formed by a cylindrical first part 104 mated with a circular second part 106. The processing in the chamber 102 may be, for example, for deposition of metal oxide film(s) on the wafer. A lid 108 is shown over the second part 106. A center hub 110 is present through the lid 108 extending to the second part 106.

Present within the chamber 102 is a substrate support 112 for positioning a wafer thereon or therein during processing. Although not shown, the system 100 will include an access into the chamber 102 for moving the wafer into and out from the chamber 102.

Depending on the particular processing system, the system 100 may also include an evacuation source 114, for pulling a vacuum on the chamber 102, and gas feeds 116, 118, for proving (e.g., reactive) gas or other to the chamber 102. To maintain the proper (gaseous) environment within the chamber 102, the engagement between various parts, such as the first part 104 and the second part 106 is desired to be fluid impermeable (e.g., gas impermeable); for this, a seal is provided between the two parts.

In the illustrated system 100, a circular seal is provided between the first part 104 and the second part 106 along the entire circumference of the first part 104 and the second part 106. As seen in FIG. 1A, the first part 104 has a groove 120 therein extending around the first part 104, in which is positioned a seal 125. The seal 125 is a continuous ring around the first part 104. The seal 125 provides a fluid-tight engagement between the first part 104 and the second part 106. Also in the system 100 is a second seal 135, provided in a groove 130 in the hub 110 adjacent to the second part 106; see FIG. 1B. Similar to the seal 125 between the first part 104 and the second part 106, the second seal 135 is circular and provides a fluid-tight engagement between the hub 110 and the second part 106.

Figure 2:
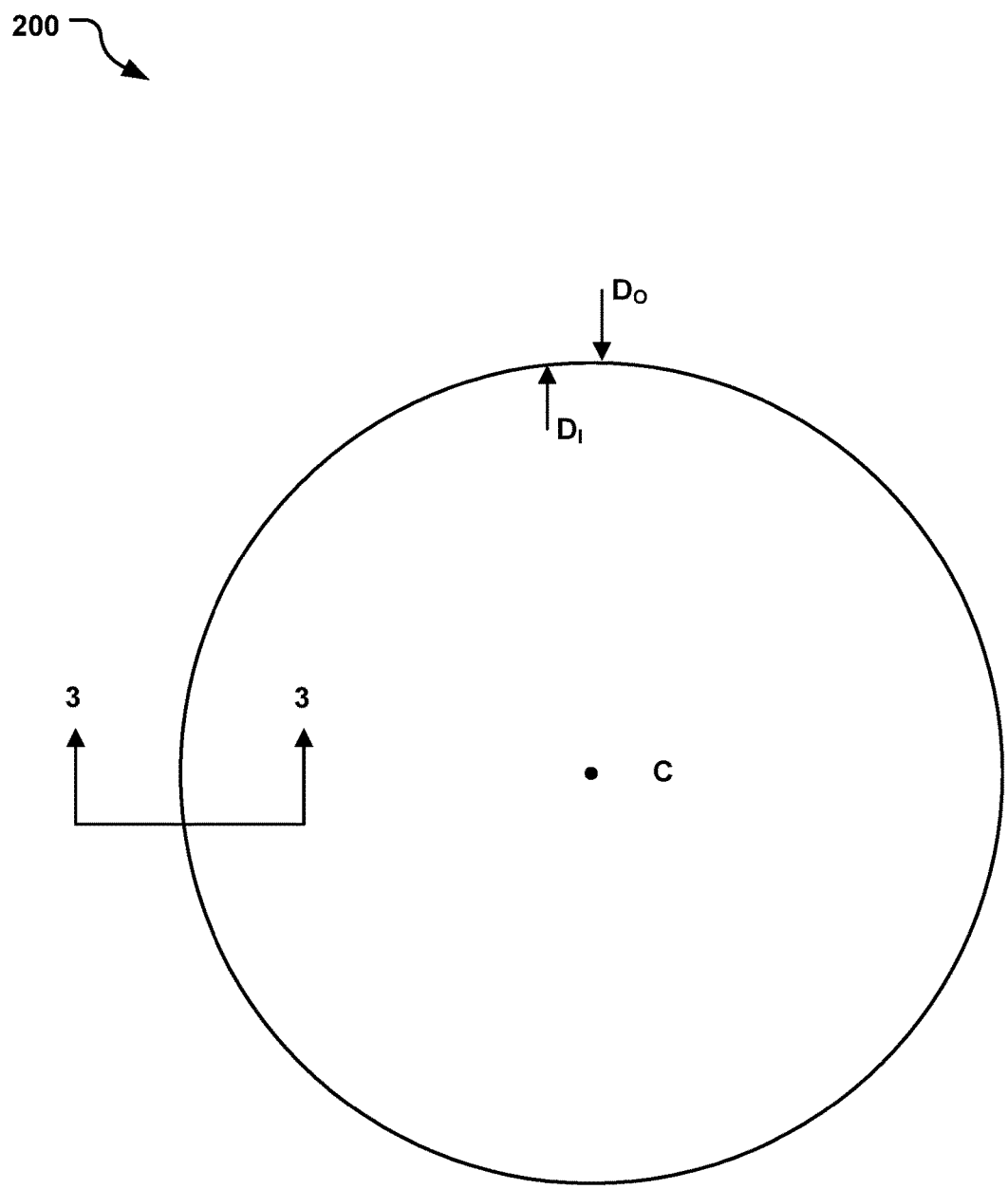
FIG. 2 is a top perspective view of a seal.

FIG. 2 illustrates a seal 200. In this implementation, the seal 200 is circular, having a radially-most inner surface $D_I$ (at the inner diameter of the seal) and a radially-most outer surface $D_O$ (at the outer diameter of the seal), as viewed in relation to a center point C of the seal 200. The seal 200 is sufficiently flexible that the shape and size can be altered by the application of force. For example, the seal 200 may be stretched to have a larger inner diameter and larger outer diameter than when at rest (when no force is acting on the seal); this will commonly occur when installing the seal 200 in its respective groove.

Although a circular seal 200, as illustrated in FIG. 2 is most common, the seal may have other shapes when at rest and/or when installed in a groove, such as oval or oblong (e.g., racetrack shaped), rectangular (e.g., square), triangular, etc.

Figure 3:
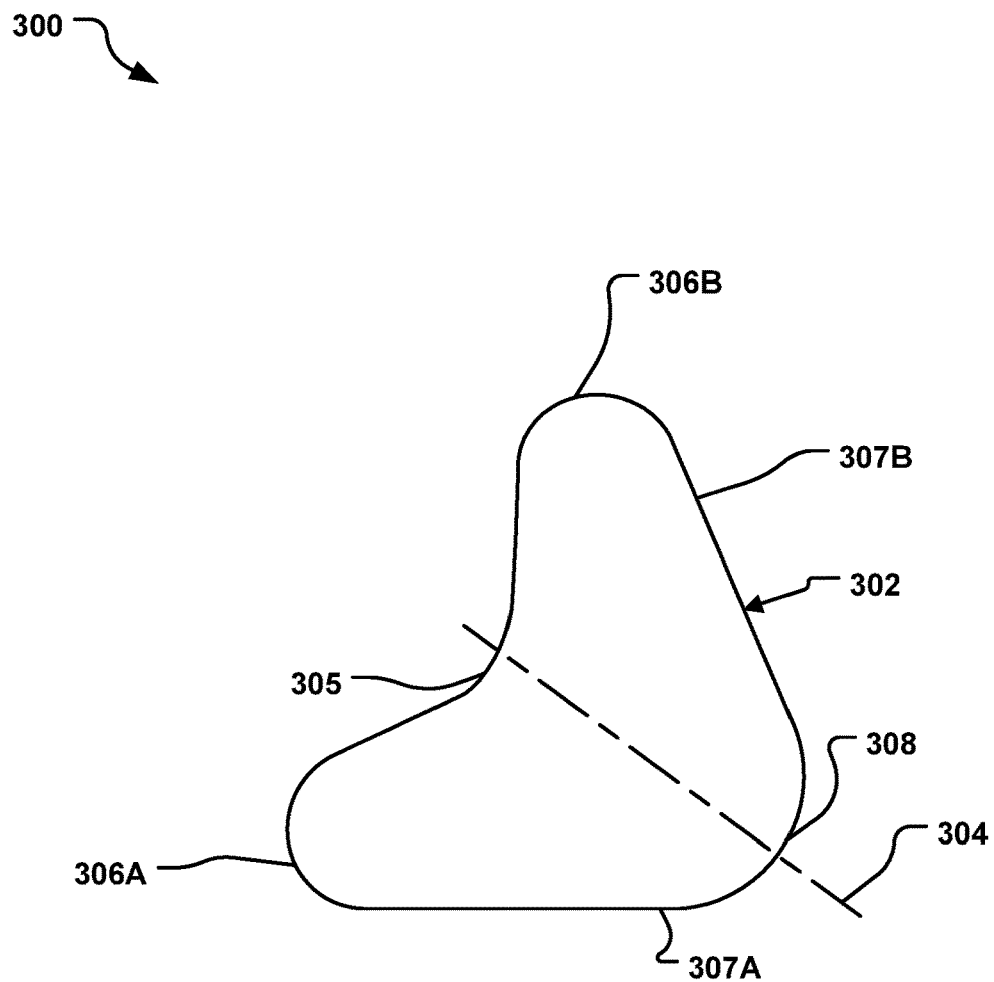
FIG. 3 is a cross-sectional view of the seal of FIG. 2 taken along line 3-3 in FIG. 2.

FIG. 3 illustrates a cross-sectional profile of the seal 200 of FIG. 2 taken from the inner surface $D_I$ to the outer surface $D_O$, radially to the center point C. As seen in FIG. 3, the seal 300, in accordance with this disclosure, has a non-circular, multi-lobed cross-sectional profile.

The seal 300 has a multi-lobed body 302 having a line of symmetry 304 extending therethrough. On one side of the line of symmetry 304 is a first lobe 306A and on the opposite side of the line of symmetry 304 is a second lobe 306B. Between the lobes 306A, 306B is a region 305, concave in relation to the lobes 306. Opposite the lobes 306 is a corner 308 through which the line of symmetry 304 extends. Connecting the first lobe 306A to the corner 308 is a first side 307A and connecting the second lobe 306B to the corner 308 is a second side 307B; in this particular implementation, the sides 307 are straight, whereas in other implementations one or both sides 307 could have convex and/or concave portion(s) or extension(s).

The first lobe 306A defines the portion of the outer surface ($D_O$, in FIG. 2) farthest from the center point C (FIG. 2) of the seal 300, or, the radially-most outer periphery of the seal 300. The corner 308 defines the portion of the inner surface ($D_I$, in FIG. 2) closest to the center point C (FIG. 2), or, the radially-most inner periphery of the seal 300.

Although the seal 300 is symmetrical about the line of symmetry 304, as described above, in other implementations one of the lobes 306 may be different than the other of the lobes 306, e.g., longer, wider, different internal angle, different side wall, or other dimensions, described below. Additionally or alternately, the region 305 may differ on the two sides of the line of symmetry 304.

Figure 4A:
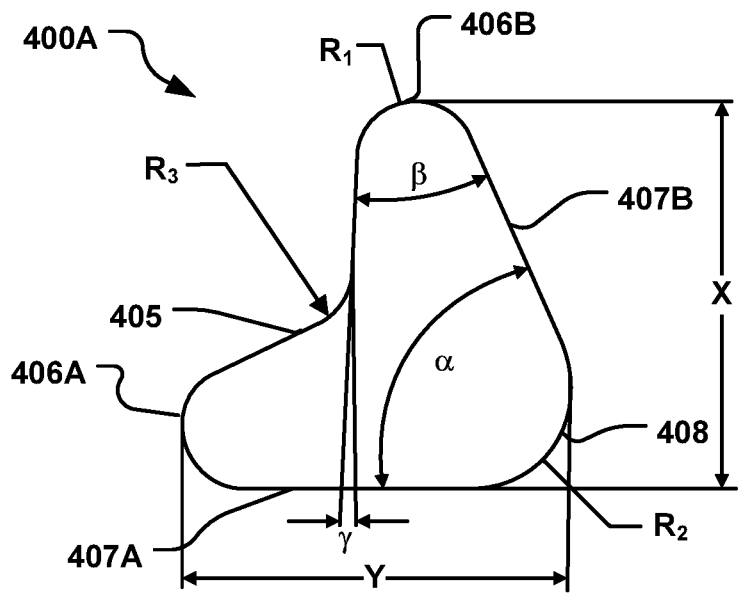
FIG. 4A is a first example implementation of a cross-sectional view of a seal, similar to that of FIG. 3.
Figure 4B:
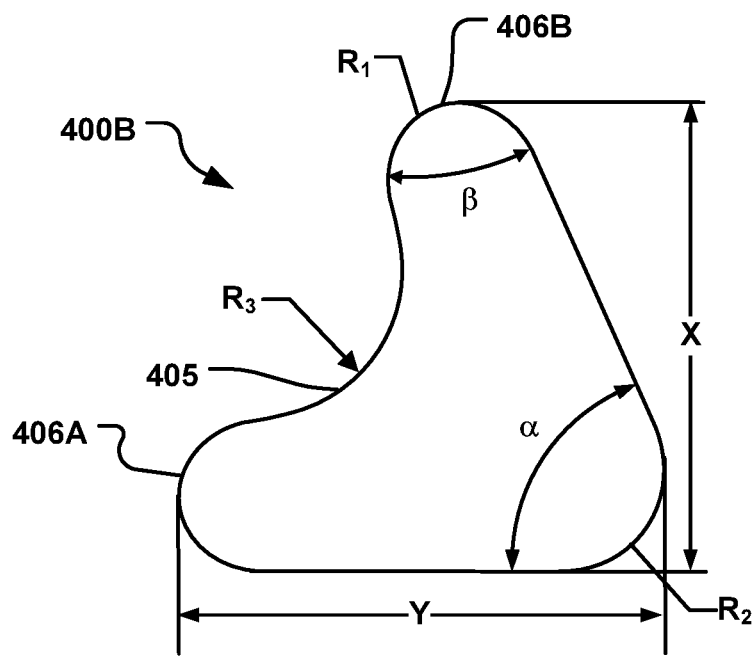
FIG. 4B is a second example implementation of a cross-sectional view of a seal.

FIGS. 4A and 4B illustrate various alternate implementations of symmetrical multi-lobed seals according to this disclosure. The identification of the various parts of the seals are generally the same as for the seal 300 of FIG. 3.

Referring to FIG. 4A, this seal 400A has a height (in the orientation of FIG. 4A), from a side 407A to the opposite lobe 406B of X, in this illustrated implementation, about 0.077 inch; similarly, the distance from the side 407B to the opposite lobe 406A is X (e.g., about 0.077inch). This seal 400A has a maximum width Y (in the orientation of FIG. 4A) from lobe 406A to the farthest point proximate corner 408, in this illustrated implementation, about 0.078 inch; similarly, the maximum distance from lobe 406B to proximate corner 408 is Y (e.g., about 0.078 inch). The seal 400A has an angle $\alpha$ for the corner 408 (e.g., between the sides 407A, 407B); in this illustrated implementation, corner angle $\alpha$ is about 66°±3°. The seal 400A also has an angle $\beta$ defining the width or thickness of the lobes 406; in this illustrated implementation, angle $\beta$ is about 26°±3°. Further, the seal 400A has a draft angle $\gamma$, which is the angle that the lobe is removed from perpendicular or orthogonal in relation to the opposite side (e.g., lobe 406A to side 407A); in this illustrated implementation, the draft angle $\gamma$ is about 2°.

Each of the lobes 406 and the corner 408 is rounded, or radiused, although in other implementations one or more of lobes 406 and/or the corner 408 may be truncated, squared off, pointed, or otherwise non-rounded. The lobes 406 have a shape defined by a radius $R_1$; in this illustrated implementation, $R_1$ is 0.012±0.003 inch. Similarly, the corner 408 has a shape defined by a radius $R_2$; in this illustrated implementation, $R_2$ is 0.020±0.003 inch. Region 405 also has a shape defined by a radius $R_3$; in this illustrated implementation, $R_3$ is 0.012±0.003 inch. This seal 400A is a suitable replacement for a conventional Ø.070 inch O-ring.

FIG. 4B illustrates an alternate implementation of a multi-lobed seal. Overall, the seal 400B of FIG. 4B is similar to the seal 400A of FIG. 4A, except that the region 405 between the lobes 406 has a draft angle that creates a concave undercut. A concave undercut may reduce the ease of molding the seal 400B, however the larger radius $R_3$ may provide more resistant to stress and/or tearing of the seal 400B.

Although specific dimensions for the various widths, lengths, angles, etc., have been provided above, it is understood that the seal can be sized to fit within any suitable gland or groove. In general, the groove will be sized appropriately for the system in which the seal is present. Examples of common sizes for the seals are commensurate with conventional O-rings, including Ø.070 inch, Ø.103 inch, Ø.139 inch, and Ø.210 inch. Although in most implementations the corner angle (e.g., angle $\alpha$) is between about 45-75 degrees, larger angles up to 90 degrees could be used.

FIGS. 5A, 5B, 5C and 5D illustrate various alternate implementations of multi-lobed seals according to this disclosure shown seated in a groove. As seen in these figures, the corner of the seal and one lobe is present within the groove and a second lobe extends above and out from the groove. The size, shape and profile of the seal can be selected to closely engage or hug the inner wall of the groove in which it is seated. In some implementations, the entire length of the seal side engages the groove wall, whereas in other implementations only a portion of wall from the corner to the extending lobe engages the groove inner wall. Having the side of the seal engage or hug the wall of the groove, particularly the inner wall of the groove, inhibits the seal from rolling and twisting when the seal is placed in the groove, when the seal is seated in the groove, and when the seal is initially compressed. Additionally, the size, shape, and profile of the seal can be selected to closely engage, or seat against, the bottom wall of the groove. Having the seal seat on the bottom wall of the groove inhibits virtual leaks (e.g., air pockets under the seal).

In each of FIGS. 5A, 5B, 5C and 5D the cross-section of groove is the same, with different seals shown in the groove. In all these figures, a groove 550 has an inner wall 552 (closest to the center point C of FIG. 2), an outer wall 554 (farthest from the center point C of FIG. 2), and a bottom wall 556. It is understood that the groove 550 has an elongate length, extending into and out from the page; the length may be infinite, as is with a circle (such as in FIG. 2). An open top side 558 allows access to the volume of the groove defined by the walls 552, 554, 556.

Figure 5A:
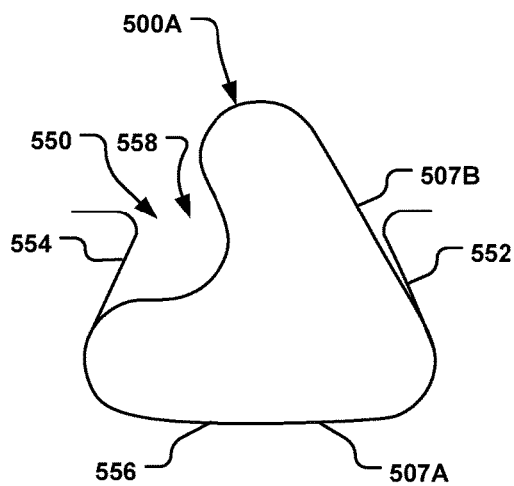
FIG. 5A is a first example implementation of a cross-sectional view of a seal seated in a groove.
Figure 5B:
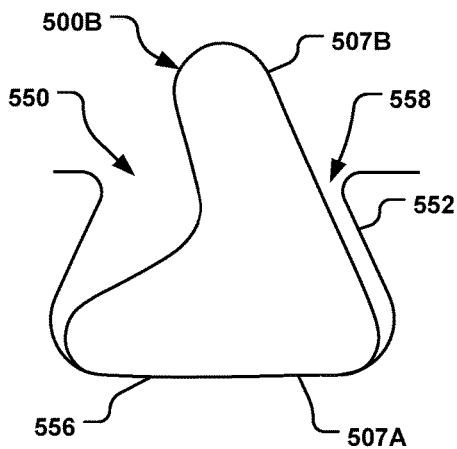
FIG. 5B is a second example implementation of a cross-sectional view of a seal seated in a groove.
Figure 5C:
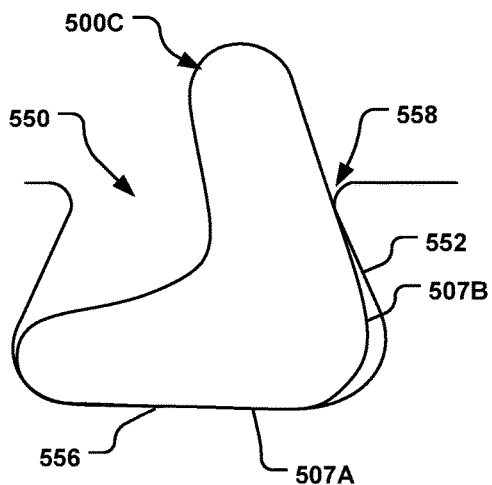
FIG. 5C is a third example implementation of a cross-sectional view of a seal seated in a groove.
Figure 5D:
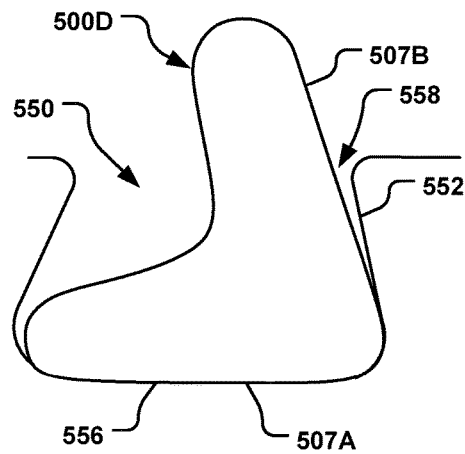
FIG. 5D is a fourth example implementation of a cross-sectional view of a seal seated in a groove.

In FIG. 5A, a seal 500A has a first side 507A that seats flush against the bottom wall 556 of the groove 550 and has a second side 507B that seats essentially flush against the groove inner wall 552 for essentially the length of the side 507B. In FIG. 5B, a seal 500B has a first side 507A that seats flush against the bottom wall 556 and has a second side 507B that does not contact but is distanced from the groove inner wall 552 for essentially the length of the side 507B. In FIG. 5C, a seal 500C has a first side 507A that seats flush against the bottom wall 556 and has a second side 507B that contacts the groove inner wall 552 proximate the open side 558 of the groove 550 but is distanced from the groove inner wall 552 close to the bottom 556 of the groove 550. In FIG. 5D, a seal 500D has a first side 507A that seats flush against the bottom 556 of the groove and has a second side 507B that contacts the groove inner wall 552 proximate the bottom wall 556 but is distanced from the groove inner wall 552 close to the open side 558 of the groove 550.

In implementations where the seal seats either flush against the bottom wall 556 of the groove 550 or has a convex bottom surface that has a single contact area with the bottom wall 556, very little or no air gets trapped under the seal. Conversely, a seal having a concave surface against the bottom of groove can result in a trapped air or other gas bubble.

As indicated above, the angle of the side wall and/or the angle of the seal corner can be selected so that the seal closely engages or hugs the inner wall of the groove in which the seal is located. To facilitate having a seal that hugs or contacts both the bottom surface and inner side wall of the groove, the seal has an angle at the corner (e.g., angle $\alpha$ from FIGS. 4A-4D) that is similar to that of the groove.

Figure 6A:
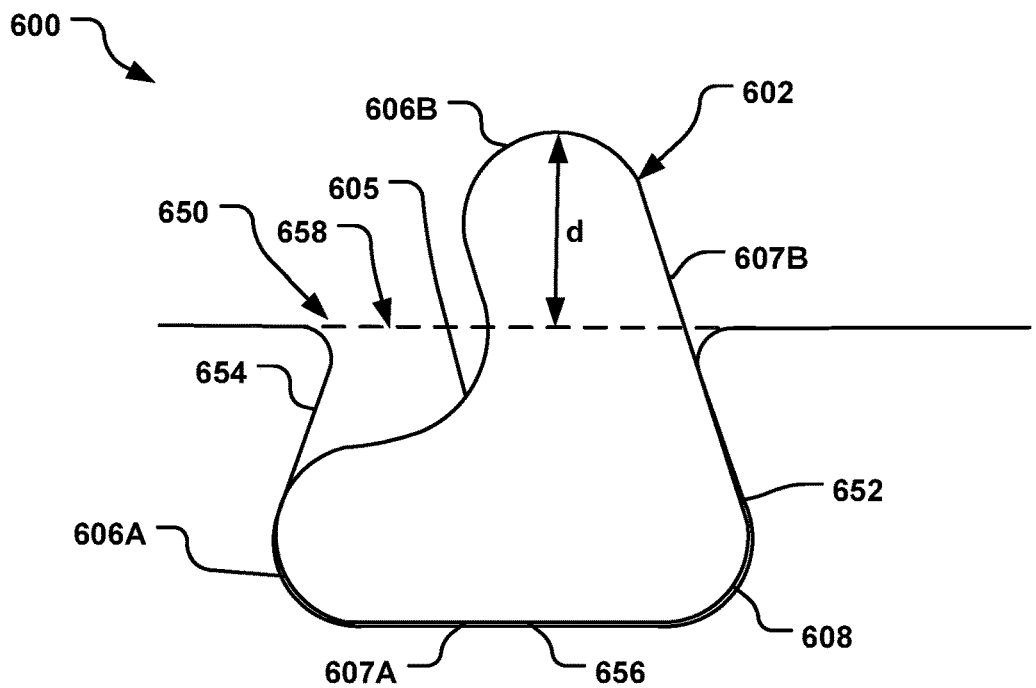
FIG. 6A is a cross-sectional side view of a seal seated in a groove.

FIG. 6A illustrates a multi-lobed seal 600 seated in a groove 650. Similar to the other seals illustrated and described, the seal 600 has a symmetrical body 602 with a first lobe 606A and an opposite second lobe 606B extending above the groove 650. Between the lobes 606A, 606B is a region 605, concave in relation to the lobes 606. Opposite the region 605 and between the lobes 606A, 606B is a corner 608. Extending from the first lobe 606A to the corner 608 is a first side 607A and extending from the second lobe 606B to the corner 608 is a second side 607B.

The seal 600 is seated in the groove 650 having an inner diameter side wall 652, and outer diameter side wall 654, a bottom wall 656, and an open end 658. The first lobe 606A is essentially flush against the bottom wall 656 and the second lobe 606B extends out of the groove 650 at the open end 658 for a distance d. This distance d can be more than for a comparable sized conventional O-ring, but not so large that it exceeds 100% gland fill at operating temperature. In some implementations, the distance d is greater than 0.01 inch (e.g., 0.016 inch) or greater than 0.03 inch.

Figure 6B:
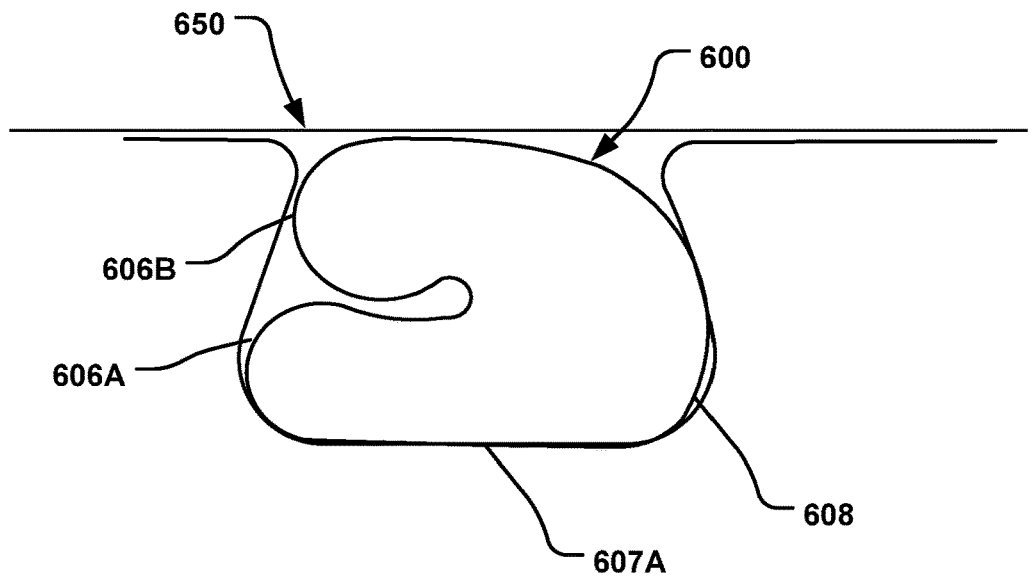
FIG. 6B is a cross-sectional side view of the seal of FIG. 6A compressed in the groove.

FIG. 6B illustrates the same seal 600 in the groove 650 closed by a second part (e.g., of system 100 of FIG. 1), thus compressing the seal 600 within the groove 650.

As can been seen in FIG. 6B, the lobe 606B, which extends out from the groove 650 in FIG. 6A, is bent or folded over into the groove 650 by the second part. The lobe 606A, first side 607A and corner 608 remain essentially flush against the groove 650. The seal 600 is flexible and conformable to fit fully within the groove 650; very little compression set of the seal 600 occurs if the gland fill is not exceeded.

Figure 7A:
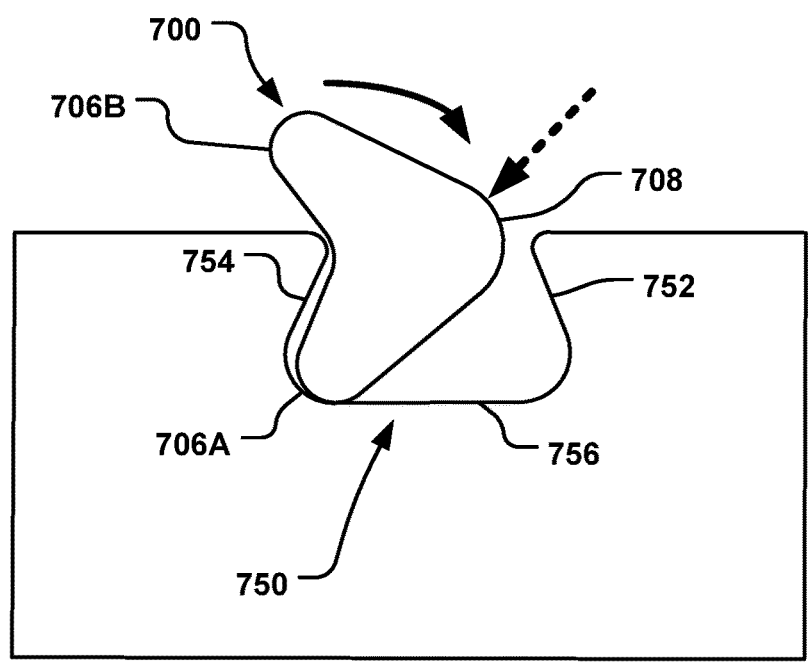
FIG. 7A is a cross-sectional side view of a seal being positioned in a groove.
Figure 7B:
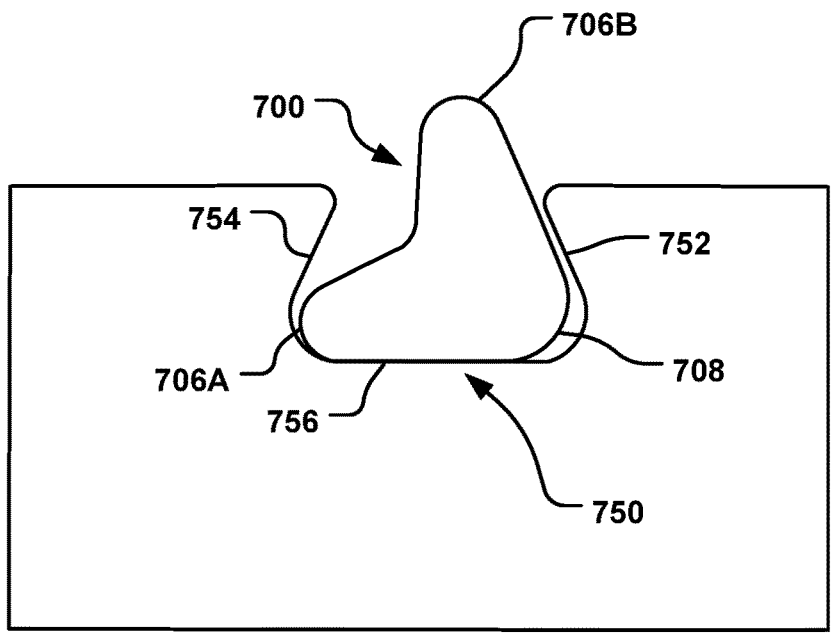
FIG. 7B is a cross-sectional side view of the seal of FIG. 7A seated in the groove.

FIGS. 7A and 7B illustrate an example method for installing a seal 700 having lobes 706A, 706B and corner 708 into a groove or gland 750. The groove 750 has an inner wall 752 (closest to the center point C of FIG. 2), an outer wall 754 (farthest from the center point C of FIG. 2), and a bottom wall 756.

Because of its shape, the seal 700 cannot be installed into the groove 750 by simply pushing it straight down, as is done with conventional O-rings. Rather, the seal 700 needs to be inserted on its side, with the first lobe 706A inserted against the outer wall 754 and rolled, as illustrated by the arrow in FIG. 7A, into the position shown in FIG. 7B, seated against the bottom wall 756. When properly seated in the groove 750, the corner 708 is proximate the inner wall 752 and the first lobe 706A is proximate the outer wall 754.

Generally, the seal 700 automatically falls into the groove 750, properly positioned. In some situations, however, e.g., if the seal 700 is on the high end of the tolerance range and the groove 750 is on the low end, pressure may be applied to the seal 700, close to or at the corner 708, to facilitate the seal 700 falling into the groove 750. The pressure can be applied, e.g., by an O-ring pick.

The seal (e.g., seals 300, 400, 500, 600, 700) can be made from any flexible (e.g., stretchable) and preferably compressible material. The material may be naturally occurring (e.g., rubber) or may be polymeric-based; the material may be thermoplastic or thermosetting.

Examples of materials include rubber (e.g., natural rubber), ethylene propylene diene monomer (EPDM) rubber, acrylonitrile butadiene styrene (ABS), ethylene-vinyl acetate (EVA), nitrile, silicone, urethane, polyester, polypropylene, polyethylene, styrene, and any copolymers and/or elastomers thereof.

Specific examples of suitable materials include Kalrez® perfluoroelastomer, Viton® elastomer, Vamac® ethylene acrylic elastomer, and Hytrel® thermoplastic polyester elastomer, all from DuPont, Estane® and Pellethane® thermoplastic polyurethanes from Lubrizol, and Aflas® fluoroelastomers from Asahi Glass Company (AGC).

The seal may be formed in any suitable manner. For example, the seal can be molded to the desired profile, shape and size, the seal can be formed using 3-D printing technology, the seal can be first extruded as an elongate length of the desired profile and then cut and spliced to the desired shape and size, or the seal can be machined to the desired profile, shape and/or size from a material having a different profile, shape and/or size.

A multi-lobed seal, as per the description above and the figures, provides a fluid tight seal between two parts when shaped and sized adequately for the groove. Having the multiple lobes, with one lobe against the bottom wall of the groove and another lobe extending out of the groove, prior to compression, in some implementations, provides a better fluid tight seal than a standard circular O-ring seal. As indicated above, a seal that seats flush with at least a portion of the bottom wall of the groove and with the at least a portion of the inner wall of the groove is highly desirable.

The seal can be sized and shaped so that after being compressed in the groove, the seal occupies at least 80% of the volume of the groove (gland fill percentage). In some implementations, the seal can occupy 85%-90% of the groove. Although a gland fill of as much as 95% and even 100% could be filled by the seal, care should be taken that the seal does not overly expand (e.g., when at elevated temperature) and thus exert undesired pressure on either of the engaged parts, which could push the two engaged parts apart or permanently damage the seal, jeopardizing the integrity of the fluid-tight seal.

Multi-lobed seals, as per the description above and the figures, may be able to be reused numerous times. Depending on the material of the seal, the shape and size of both the seal and the groove, the conditions to which the seal has been exposed, and also the time duration the seal has been compressed, the seal remains flexible without deteriorating (e.g., cracking). In some situations, the seal automatically 'bounces back' after having been compressed. Additionally, the seal has a low overall compression set, lower than a standard circular O-ring seal. Because of the multiple lobe shape, together with the elastomeric material, compression set (as per ASTM D395) may be less than 10%, and in some implementations less than 5%.

The above specification and examples provide a complete description of the structure, features and use of exemplary implementations of the invention. Since many implementations of the invention can be made without departing from the spirit and scope of the invention, the invention resides in the claims hereinafter appended. Furthermore, structural features of the different implementations may be combined in yet another implementation without departing from the recited claims.

What is claimed is:

1. An assembly comprising a seal seated in a groove defined by an inner wall, an outer wall and a bottom wall, the seal having a cross-sectional profile comprising:
   a first outer surface and a first inner surface defining a first lobe, a second outer surface and a second inner surface defining a second lobe, and a corner, the first outer surface extending from the first lobe to the corner, and the second outer surface extending from the second lobe to the corner, the first outer surface and the first inner surface being nonparallel and the second outer surface and the second inner surface being nonparallel;
   the first lobe defining an outer-most surface of the seal;
   the corner defining an inner-most surface of the seal;
   the seal seated with the first lobe proximate the outer wall, the first outer surface proximate the bottom wall and the corner, and the second outer surface proximate the inner wall,
   such that when the seal is compressed into the groove, the seal fills at least 80% of the groove.

2. The assembly of claim 1, wherein the corner has an angle defined by the first outer surface and the second outer surface, the angle being between 45 and 90 degrees, inclusive.

3. The assembly of claim 2, wherein the corner angle is between 45 and 75 degrees, inclusive.

4. The assembly of claim 1, wherein the seal has a line of symmetry extending from the corner and between the first lobe and the second lobe.

5. The assembly of claim 1, wherein the second lobe extends out from the groove when the seal is not compressed into the groove.

6. The assembly of claim 5, wherein the second lobe extends out from the groove at least 0.016 inch.

7. The assembly of claim 1, wherein the second outer surface is against the inner wall of the groove for an entire length of the inner wall.

8. The assembly of claim 1, wherein the second outer surface is against the inner wall proximate the corner.

9. The assembly of claim 1, wherein the seal comprises an elastomer.

10. The assembly of claim 9, wherein the seal comprises a fluoroelastomer.

11. The assembly of claim 1, wherein the first outer surface and the first inner surface form an angle of 23 to 29 degrees and the second outer surface and the second inner surface form an angle of 23 to 29 degrees.

12. A seal having a cross-sectional profile comprising a first lobe having an angle between 23 and 29 degrees, inclusive, defined by a first outer surface and a first inner surface, a second lobe having an angle between 23 and 29 degrees, inclusive, defined by a second outer surface and a second inner surface, and a corner having an angle between 45 and 90 degrees, inclusive, the first outer surface and the second outer surface defining the corner angle.

13. The seal of claim 12, wherein the corner angle is between 45 and 75 degrees, inclusive.

14. The seal of claim 13 having a line of symmetry extending from the corner and between the first lobe and the second lobe.

15. The seal of claim 12 comprising an elastomer.

16. The seal of claim 15 comprising a fluoroelastomer.

* * * * *